(12) United States Patent
Chun

(10) Patent No.: US 8,912,662 B2
(45) Date of Patent: Dec. 16, 2014

(54) WAFER-LEVEL PACKAGE AND METHOD OF MANUFACTURING THE SAME

(71) Applicant: STS Semiconductor & Telecommunications Co., Ltd., Chungcheongnam-do (KR)

(72) Inventor: Jung Hwan Chun, Chungcheongnam-do (KR)

(73) Assignee: STS Semiconductor & Telecommunications Co., Ltd., Chungcheongnam-Do (KR)

( * ) Notice: Subject to any disclaimer, the term of this patent is extended or adjusted under 35 U.S.C. 154(b) by 15 days.

(21) Appl. No.: 13/753,862

(22) Filed: Jan. 30, 2013

(65) Prior Publication Data

US 2013/0320518 A1    Dec. 5, 2013

(30) Foreign Application Priority Data

May 31, 2012  (KR) .................. KR10-2012-0058774

(51) Int. Cl.
| | | |
|---|---|---|
| H01L 23/48 | (2006.01) | |
| H01L 23/52 | (2006.01) | |
| H01L 29/40 | (2006.01) | |
| H01L 23/34 | (2006.01) | |
| H01L 21/56 | (2006.01) | |
| H01L 23/31 | (2006.01) | |
| H01L 23/36 | (2006.01) | |
| H01L 25/065 | (2006.01) | |
| H01L 23/00 | (2006.01) | |
| H01L 23/525 | (2006.01) | |

(52) U.S. Cl.
CPC .............. *H01L 23/34* (2013.01); *H01L 21/56* (2013.01); *H01L 23/3114* (2013.01); *H01L 23/36* (2013.01); *H01L 25/0657* (2013.01); *H01L 24/97* (2013.01); *H01L 25/0652* (2013.01); *H01L 2224/16145* (2013.01); *H01L 2224/32145* (2013.01); *H01L 2224/73204* (2013.01); *H01L 2924/18161* (2013.01); *H01L 23/525* (2013.01); *H01L 21/561* (2013.01); *H01L 2225/06586* (2013.01); *H01L 2224/16225* (2013.01); *H01L 2224/94* (2013.01); *H01L 2224/97* (2013.01); *H01L 2225/06517* (2013.01); *H01L 2225/06513* (2013.01); *H01L 2225/06568* (2013.01)
USPC ............ 257/777; 257/724; 257/686; 257/787

(58) Field of Classification Search
CPC . H01L 224/97; H01L 24/16; H01L 224/0401; H01L 24/81; H01L 25/0652; H01L 23/5389; H01L 24/14; H01L 2225/06517; H01L 23/49616
USPC .................. 257/723, 724, 778, 787, 777, 686
See application file for complete search history.

(56) References Cited

U.S. PATENT DOCUMENTS

| | | | | |
|---|---|---|---|---|
| 7,969,020 B2 * | 6/2011 | Chan et al. | ..................... | 257/777 |
| 8,324,020 B2 * | 12/2012 | Eichelberger et al. | ........ | 438/106 |
| 8,796,846 B2 * | 8/2014 | Lin et al. | ....................... | 257/737 |

FOREIGN PATENT DOCUMENTS

| | | |
|---|---|---|
| KR | 1020080053241 A | 6/2008 |
| KR | 1020100121231 A | 11/2010 |
| KR | 1020110094440 A | 8/2011 |

*Primary Examiner* — S. V. Clark
(74) *Attorney, Agent, or Firm* — Kilpatrick Townsend & Stockton LLP

(57) ABSTRACT

A wafer-level package and a method of manufacturing the same. The wafer-level package includes a first semiconductor chip on an upper side of which an active surface facing downward is disposed, a redistribution formed on the active surface of the first semiconductor chip, a second semiconductor chip disposed on the redistribution using a flip-chip bonding (FCP) technique, a copper (Cu) post and a first solder ball sequentially disposed on the redistribution, a molding member formed on the active surface of the first semiconductor chip to expose a bottom surface of the first solder ball and an inactive surface of the second semiconductor chip, and a second solder ball disposed on the first solder ball and electrically connected to an external apparatus.

7 Claims, 7 Drawing Sheets

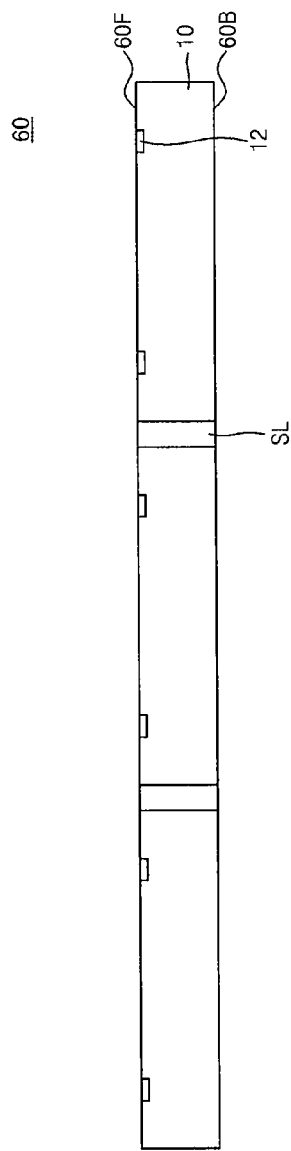
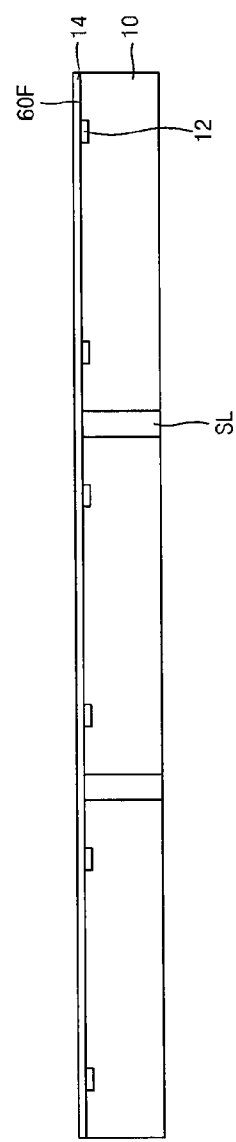
FIG. 4
FIG. 5

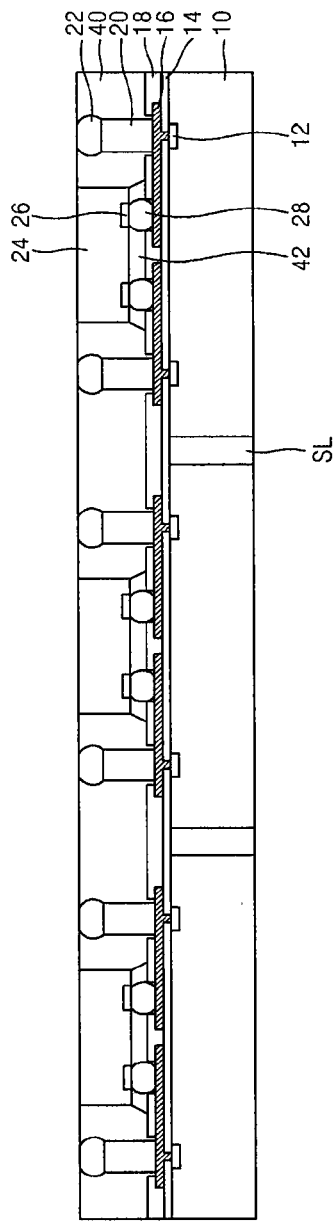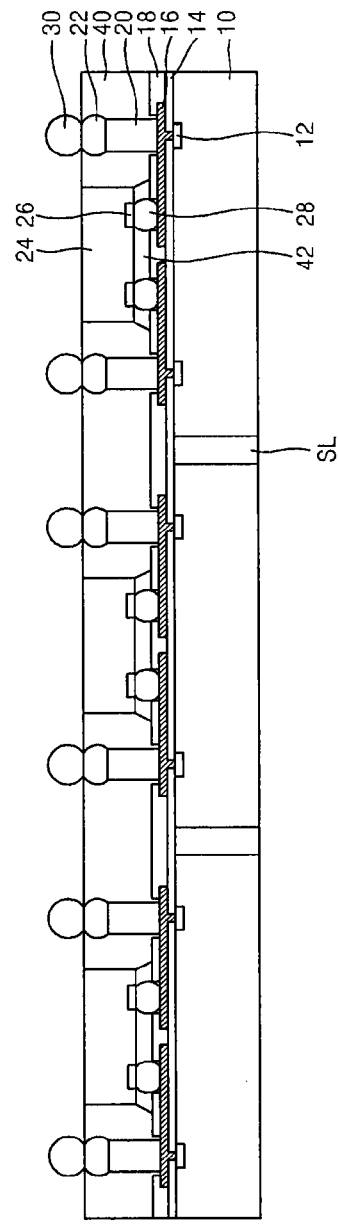

WAFER-LEVEL PACKAGE AND METHOD OF MANUFACTURING THE SAME

CROSS-REFERENCE TO RELATED PATENT APPLICATION

This application claims the benefit of Korean Patent Application No. 10-2012-0058774, filed on May 31, 2012, in the Korean Intellectual Property Office, the disclosure of which is incorporated herein in its entirety by reference.

BACKGROUND OF THE INVENTION

1. Field of the Invention

The present invention relates to a wafer-level package, and more particularly, to a wafer-level package including a flip-chip bonding (FCB) structure and a method of manufacturing the same.

2. Description of the Related Art

Electronic products have gradually been downscaled and need to process a high capacity of data. Thus, semiconductor packages used for the electronic products need to be highly integrated and downscaled. Also, the use of multifunctional electronic products has led to a need for multifunctional semiconductor packages. As a result, it is necessary to increase the integration density of semiconductor packages, and a structure with a low height is required to embody a multi-chip package.

SUMMARY OF THE INVENTION

The present invention provides a wafer-level package capable of improving operation speed and integration density thereof.

According to an aspect of the present invention, there is provided a wafer-level package including: a first semiconductor chip on an upper side of which an active surface facing downward is disposed; a redistribution formed on the active surface of the first semiconductor chip; a second semiconductor chip disposed on the redistribution using a flip-chip bonding (FCP) technique; a copper (Cu) post and a first solder ball sequentially disposed on the redistribution; a molding member formed on the active surface of the first semiconductor chip to expose a top surface of the first solder ball and an inactive surface of the second semiconductor chip; and a second solder ball disposed on the first solder ball and electrically connected to an external apparatus.

The copper post and the first solder ball may be formed apart from the second semiconductor chip.

The second semiconductor chip may have a smaller width than the first semiconductor chip.

The wafer-level package may further include a first heat sink disposed on a top surface of the first semiconductor chip.

The wafer-level package may further include a second heat sink disposed on a bottom surface of the second semiconductor chip.

The redistribution may be electrically connected to a pad of the first semiconductor chip.

The bottom surface of the first solder ball may be at the same level as a bottom surface of the second semiconductor chip.

According to another aspect of the present invention, there is provided a method of manufacturing a wafer-level package. The method includes: preparing a wafer including a plurality of first semiconductor chips; forming an insulating layer on the entire surface of the wafer to expose a pad of each of the first semiconductor chips; forming a redistribution on the insulating layer to be electrically connected to the pad; disposing a plurality of second semiconductor chips facing an active surface of each of the first semiconductor chips on the redistribution using a flip-chip bonding (FCB) technique; sequentially stacking a plurality of copper (Cu) posts and a plurality of first solder balls on the redistribution to be spaced apart from the second semiconductor chip; forming a molding member to expose a top surface of the plurality of first solder balls and an inactive surface of the second semiconductor chip; and disposing a plurality of second solder balls on the top surface of the plurality of first solder balls.

The method may further include disposing a first heat sink on a bottom surface of the first semiconductor chip and disposing a second heat sink on a top surface of the second semiconductor chip.

The top surface of the first solder ball may be at the same level as a top surface of the second semiconductor chip.

BRIEF DESCRIPTION OF THE DRAWINGS

The above and other features and advantages of the present invention will become more apparent by describing in detail exemplary embodiments thereof with reference to the attached drawings in which:

FIGS. 4 through 13 are cross-sectional views illustrating sequential processes of a method of manufacturing a wafer-level package according to an embodiment of the present invention.

DETAILED DESCRIPTION OF THE INVENTION

Figure 1:
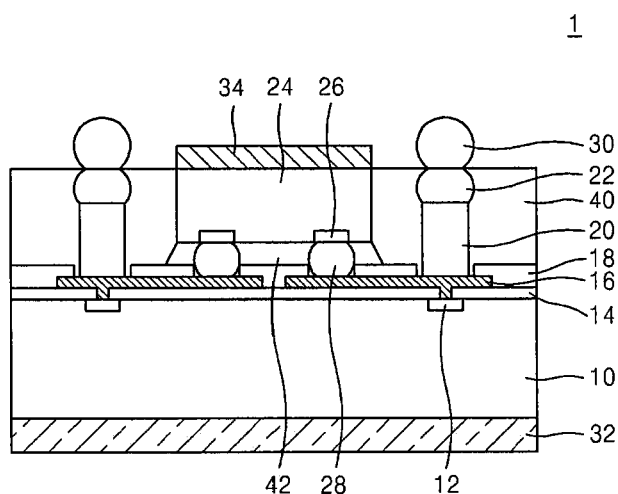
FIG. 1 is a cross-sectional view of a wafer-level package according to an embodiment of the present invention.

The present invention is described more fully hereinafter with reference to the accompanying drawings, in which embodiments of the invention are shown. In the drawings, the same reference numerals are used to denote the same elements, and repeated description thereof is omitted. This invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing.

FIG. 1 is a cross-sectional view of a wafer-level package 1 according to an embodiment of the present invention.

Referring to FIG. 1, the wafer-level package 1 may include first and second semiconductor chips 10 and 24 vertically stacked such that active surfaces of the respective first and second semiconductor chips 10 and 24 face each other, a redistribution 16 formed on a top surface of the first semiconductor chip 10, a copper (Cu) post 20 protruding on the redistribution 16, a first solder ball 22 disposed on the copper post 20, and a molding member 40 formed to expose top surfaces of the second semiconductor chip 24 and the first solder ball 22 and cover the first semiconductor chip 10.

The first semiconductor chip 10 may include an internal integrated circuit (IC). At least one pad 12 connected to the internal IC may be formed on the active surface of the first semiconductor chip 10. The pad 12 may include at least one material selected from the group consisting of aluminum (Al), copper (Cu), silver (Ag), gold (Au), and palladium (Pd).

The first semiconductor chip 10 may be a memory chip. The memory chip may include memory circuits having various shapes, for example, a dynamic random access memory (DRAM) circuit, a static RAM (SRAM) circuit, a flash memory circuit, a phase-change RAM (PRAM) circuit, a resistive RAM (ReRAM) circuit, a ferroelectric RAM (FeRAM) circuit, or a magnetic RAM (MRAM) circuit.

An insulating layer 14 may be formed on the top surface of the first semiconductor chip 10 to expose the pad 12 of the first semiconductor chip 10. The redistribution 16 may be formed on the insulating layer 14 and electrically connected to the pad 12. A solder resist 18 may be formed on the insulating layer 14 to expose a partial region of the redistribution 16.

The insulating layer 14 may absorb externally applied stress and prevent damage to the pad 12 and the redistribution 16. Also, the insulating layer 14 may electrically insulate a circuit formed in the first semiconductor chip 10 from an external conductor. The insulating layer 14 may be formed of a thermally conductive low-k dielectric material. The thermal conductive low-k dielectric material may be, for example, a silicon compound.

The redistribution 16 may be disposed on the top surface of the first semiconductor chip 10 and include at least one material selected from the group consisting of aluminum (Al), copper (Cu), tin (Sn), nickel (Ni), gold (Au), platinum (Pt), and an alloy thereof. Also, the redistribution 16 may have a multi-layered structure formed by sequentially stacking copper, gold, and nickel.

The second semiconductor chip 24 may be disposed on the redistribution 16 using a flip-chip bonding (FCB) technique such that the active surface of the second semiconductor chip 24 faces the active surface of the first semiconductor chip 10.

The second semiconductor chip 24 may be electrically connected to the first semiconductor chip 10 through at least one bump 28, the redistribution 16, and the pad 12. Since the active surface of the first semiconductor chip 10 faces the active surface of the second semiconductor chip 24, an operation path formed by the bump 28 and the redistribution 16 may be reduced, thereby improving the performance of the wafer-level package 1.

The second semiconductor chip 24 may include an internal IC. At least one pad 26 connected to the internal IC may be formed on the active surface of the second semiconductor chip 24. The pad 26 may include at least one material selected from the group consisting of aluminum, copper, silver, gold, and palladium.

The second semiconductor chip 24 may be a semiconductor chip. The memory chip may include memory chips having various shapes, for example, a DRAM circuit, an SRAM circuit, a flash circuit, a PRAM circuit, an ReRAM circuit, an FeRAM circuit, or an MRAM circuit.

The copper post 20 may be disposed on the redistribution 16. The copper post 20 may be formed using an electroplating process. However, the present invention is not limited thereto.

A first solder ball 22 may be disposed on the copper post 20. The first solder ball 22 may be formed using a plating process or a reflow process. Alternatively, the first solder ball 22 may be directly adhered to the copper post 20. The first solder ball 22 may be formed using a binary alloy or a ternary alloy. The binary alloy may be tin-silver (Sn—Ag), tin-copper (Sn—Cu), tin-zinc (Sn—Zn), or tin-bismuth (Sn—Bi), and the ternary alloy may be tin-silver-copper (Sn—Ag—Cu), tin-silver-indium (Sn—Ag—In), or tin-bismuth-zinc (Sn—Bi—Zn).

The height of the copper post 20 or the first solder ball 22 may be selected such that a top surface the first solder ball 22 is the same level as a top surface of the second semiconductor chip 24.

A plurality of copper posts 20 may be formed at a predetermined distance apart from the second semiconductor chip 24 on the redistribution 16 to surround the second semiconductor chip 24.

The redistribution 16 may be formed on the first semiconductor chip 10, and the copper post 20 and the second semiconductor chip 24 may be disposed on the redistribution 16. Accordingly, the second semiconductor chip 24 disposed on the first semiconductor chip 10 may be adjusted to have a width less than the width of the first semiconductor chip 10.

The molding member 40 may expose the top surface of the second semiconductor chip 24 and the top surface of the first solder ball 22 and cover the first semiconductor chip 10.

Also, the wafer-level package 1 may further include an under-fill member 42 disposed between the first and second semiconductor chips 10 and 24.

The under-fill resin 42 may prevent joint reliability of the wafer-level package 1 from dropping due to a difference in coefficient of thermal expansion between the solder resist 18 and the second semiconductor chip 24 and protect the bump 28 from the external environment. The under-fill member 42 may be an insulating material, such as an epoxy resin.

A second solder ball 30 may be disposed on the first solder ball 22, and the wafer-level package 1 may be electrically connected to an external apparatus (e.g., a mainboard) through the second solder ball 30.

Furthermore, the wafer-level package 1 according to the embodiment of the present invention may further include a first heat sink 32 disposed on a bottom surface of the first semiconductor chip 10.

The first heat sink 32 may be formed on the bottom surface (i.e., an inactive surface) of the first semiconductor chip 10 using a conductive adhesive member (not shown). The first heat sink 32 may include a metal, a metal nitride, a ceramic, a resin, or a combination thereof. For example, the first heat sink 32 may include aluminum, an aluminum alloy, copper, a copper alloy, aluminum oxide ($Al_2O_3$), beryllium oxide (BeO), aluminum nitride (AlN), silicon nitride (SiN), an epoxy resin, or a combination thereof. Also, the first heat sink 32 may have various dimensions and shapes to enable more effective heat radiation.

In addition, the wafer-level package 1 according to the embodiment of the present invention may further include a second heat sink 34 disposed on the top surface of the second semiconductor chip 24.

The second heat sink 34 may be formed on the top surface (i.e., an inactive surface) of the second semiconductor chip 24 using a conductive adhesive member (not shown).

The second heat sink 34 may include a metal, a metal nitride, a ceramic, a resin, or a combination thereof. For instance, the second heat sink 34 may include aluminum, an aluminum alloy, copper, a copper alloy, aluminum oxide, beryllium oxide, aluminum nitride, silicon nitride, an epoxy resin, or a combination thereof.

Furthermore, the second heat sink 34 may have various dimensions and shapes to enable more effective heat radiation. For example, the second heat sink 34 may include a plurality of fins to increase heat radiation efficiency. Also, when the second solder ball 30 is mounted on an external apparatus, such as a mainboard, the height of the second heat sink 34 may be selected such that the second heat sink 34 is in contact with the external apparatus. Conversely, the height of the second solder ball 30 may be selected such that the second heat sink 34 is in contact with the external apparatus.

That is, since the height of the second heat sink 34 or the second solder ball 30 may be selected such that the second heat sink 34 is in contact with the external apparatus, heat generated by the first and second semiconductor chips 10 and 24 may be efficiently or forcibly transmitted to the outside. However, the present invention is not limited thereto, and the second heat sink 34 may be formed to have a height corresponding to a predetermined distance apart from the external apparatus.

In the wafer-level package 1 according to the embodiment of the present invention, since the second semiconductor chip 24 and the copper post 20 are directly disposed on the top surface of the first semiconductor chip 10, it may be unnecessary to form a redistribution required for electrical connection with the external apparatus on the bottom surface of the first semiconductor chip 10. Accordingly, the height of the wafer-level package 1 may be reduced, the entire process may be simplified, and fabrication costs may be reduced.

Furthermore, since the second solder ball 30 is disposed on a top surface of the wafer-level package 1, the first and second heat sinks 32 and 34 may be respectively disposed on the bottom surface of the first semiconductor chip 10 and the top surface of the second semiconductor chip 24. Thus, since heat generated by the first and second semiconductor chips 10 and 24 may be effectively externally emitted, performance of the wafer-level package 1 may improve. Also, the second solder ball 30 electrically connected to the external apparatus may be electrically connected to the first semiconductor chip 10 through the first solder ball 22, the copper post 30, the redistribution 16, and the pad 12, and the first semiconductor chip 10 may be connected to the second semiconductor chip 24 using an FCB technique. As a result, a signal path between the first and second semiconductor chips 10 and 24 may be shortened, thereby improving speed at which signals are transmitted between the wafer-level package 1 and the external apparatus.

Figure 2:
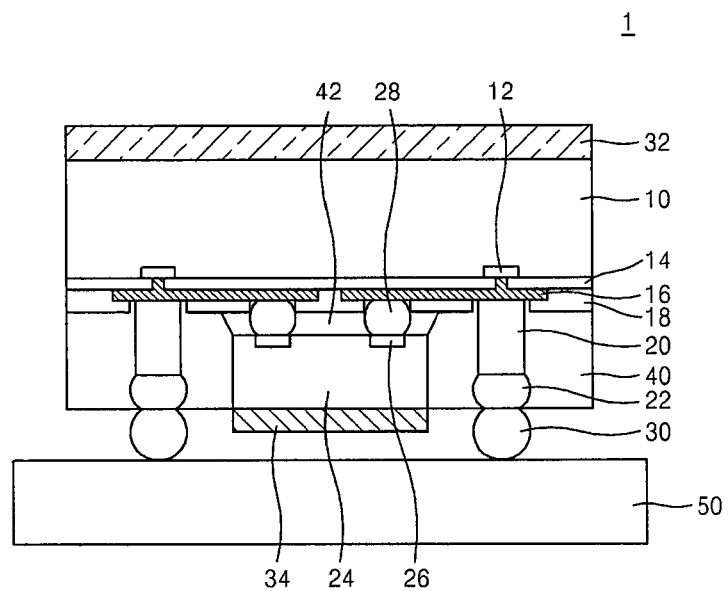
FIG. 2 is a cross-sectional view showing connection of the wafer-level package of FIG. 1 with an external apparatus, according to an embodiment of the present invention.

FIG. 2 is a cross-sectional view showing connection of the wafer-level package of FIG. 1 with an external apparatus, according to an embodiment of the present invention. In FIG. 2, the same reference numerals are used to denote the same elements as in FIG. 1, and a repeated description thereof is omitted for brevity.

Referring to FIG. 2, the wafer-level package 1 may be electrically connected to the external apparatus 50 (e.g., a mainboard) through the second solder ball 30. That is, the wafer-level package 1 may transmit and receive signals to and from the external apparatus 50 through the second solder ball 30.

Although FIG. 2 illustrates that the wafer-level package 1 is disposed on the external apparatus 50 such that the second heat sink 34 is spaced a predetermined distance apart from the external apparatus 50, the present invention is not limited thereto. For example, the height of the second solder ball 30 or the second heat sink 34 may be selected such that the second heat sink 34 is in contact with the external apparatus 50.

The external apparatus 50 may be electrically connected to the first semiconductor chip 10 through the second solder ball 30, the first solder ball 22, the copper post 20, the redistribution 16, and the pad 12, and the first semiconductor chip 10 may be electrically connected to the second semiconductor chip 24 through the redistribution 16, the bump 28, and the pad 26.

Heat generated by the second semiconductor chip 24 may be emitted through the second heat sink 34 or through the first heat sink 32 disposed on an inactive surface of the first semiconductor chip 10.

In addition, a fan (not shown) configured to forcibly emit heat generated by the first and second semiconductor chips 10 and 24 may be further provided on each of the first and second heat sinks 32 and 34.

Figure 3:
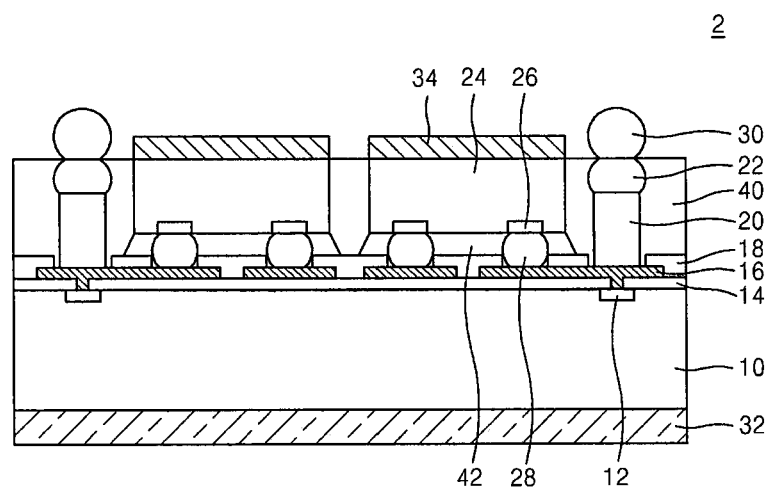
FIG. 3 is a cross-sectional view of a wafer-level package according to an embodiment of the present invention.

FIG. 3 is a cross-sectional view of a wafer-level package 2 according to an embodiment of the present invention. In FIG. 3, the same reference numerals are used to denote the same elements as in FIG. 1, and a repeated description thereof is omitted for brevity.

Referring to FIG. 3, the wafer-level package 2 may include a plurality of second semiconductor chips 24 horizontally aligned with one another on a first semiconductor chip 10.

A molding member 40 may be formed on a top surface (i.e., inactive surface) of the first semiconductor chip 10 to expose a top surface (i.e., inactive surface) of each of the plurality of second semiconductor chips 24 and a top surface of a first solder ball 22.

Although FIG. 3 illustrates that two second semiconductor chips 24 are mounted in the molding member 40, the present invention is not limited thereto. Also, the plurality of second semiconductor chips 24 may be like products with the same size, but the present invention is not limited thereto.

FIGS. 4 through 13 are cross-sectional views illustrating sequential processes of a method of manufacturing a wafer-level package according to an embodiment of the present invention.

Referring to FIG. 4, a wafer 60 may be prepared. The wafer 60 may have a front surface 60F and a back surface 60B. A plurality of first semiconductor chips 10 may be formed on the front surface 60F. Each of the plurality of first semiconductor chips 10 is divided by scribe line (SL).

At least one pad 12 connected to an internal IC may be formed on an active surface of the first semiconductor chip 10. The pad 12 may include at least one material selected from the group consisting of aluminium, copper, silver, gold, and palladium.

The first semiconductor chip 10 may be a memory chip. The memory chip may include memory chips having various shapes, for example, a DRAM circuit, an SRAM circuit, a flash circuit, a PRAM circuit, an ReRAM circuit, an FeRAM circuit, or an MRAM circuit.

In addition, the wafer 60 may be a silicon wafer, a silicon-on-insulator (SOI) wafer, a gallium arsenic (GaAs) wafer, a silicon germanium (SiGe) wafer, a ceramic wafer, or a quartz wafer, but the present invention is not limited to those examples.

Referring to FIG. 5, an insulating layer 14 may be formed on the front surface 60F of the wafer 60.

The insulating layer 14 may be formed of a thermally conductive low-k dielectric material. A silicon compound may be used as the thermally conductive low-k dielectric material. Also, the insulating layer 14 may be formed of a material having a coefficient of thermal expansion equal or similar to that of the wafer 60 to enhance reliability of the wafer-level package 1 of FIG. 13.

Figure 6:
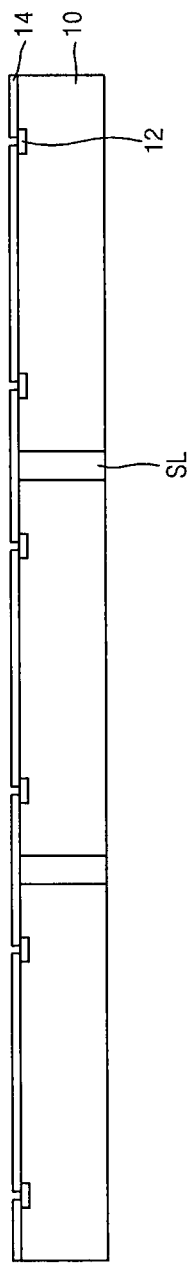

Referring to FIG. 6, a pattern exposing the pad 12 of the first semiconductor chip 10 may be formed in the first insulating layer 14 using a photolithography process using a mask.

Figure 7:
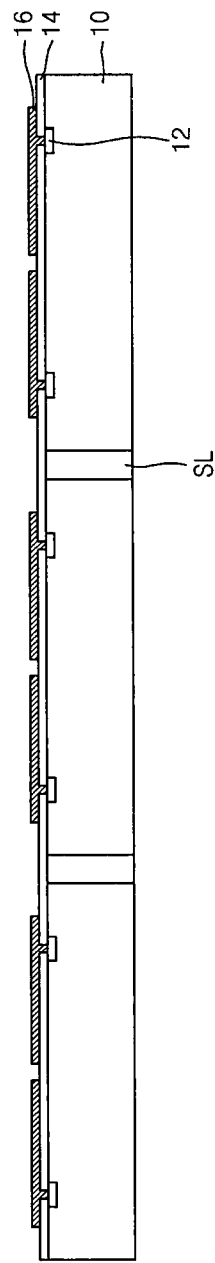

Referring to FIG. 7, a redistribution 16 may be formed on the insulating layer 14 and electrically connected to the pad 12. The formation of the redistribution 16 may include forming a conductive layer, coating a photoresist layer, exposing and developing the photoresist layer, and etching the photoresist layer. Alternatively, the redistribution 16 may be originally patterned using a screen printing process.

Figure 8:
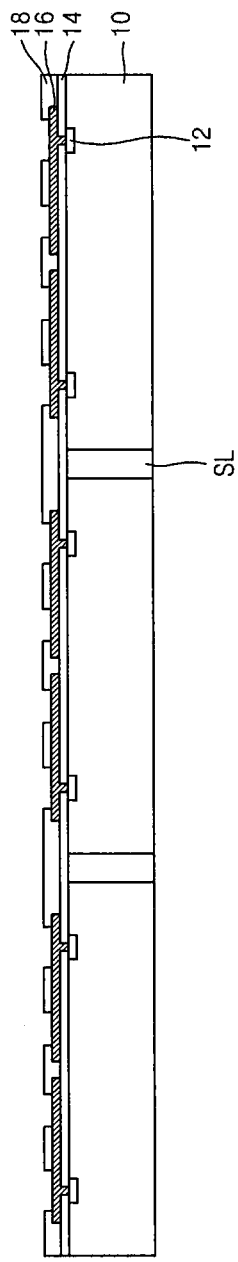

Referring to FIG. 8, a solder resist 18 may be formed on the insulating layer 14 to cover the redistribution 16.

Exposure and developing processes may be performed on the solder resist 18 to expose a predetermined region of the redistribution 16.

Figure 9:
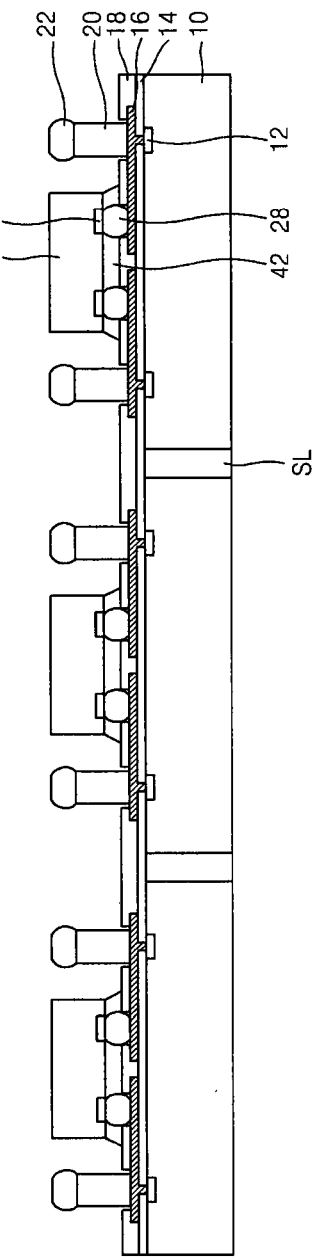

Referring to FIG. 9, a copper post 20 may be formed on the redistribution 16. The formation of the copper post 20 may include depositing and plating copper on the redistribution 16.

Next, a first solder ball 22 may be formed on the copper post 20. The first solder ball 22 may be formed using a plating process or a reflow process. Alternatively, the first solder ball 22 may be directly adhered to the copper post 20. The first solder ball 22 may be formed using a binary alloy or a ternary alloy. The binary alloy may be tin-silver, tin-copper, tin-zinc, or tin-bismuth, and the ternary alloy may be tin-silver-copper, tin-silver-indium, or tin-bismuth-zinc. Also, a reflow process may be further performed to form the first solder ball 22 in a circular shape.

In addition, a second semiconductor chip 24 may be disposed on the redistribution 16 using an FCB technique. An active surface of the second semiconductor chip 24 may be disposed opposite the active surface of the first semiconductor chip 10, and the second semiconductor chip 24 may be electrically connected to the first semiconductor chip 10 through a bump 28, the redistribution 16, and the pad 12.

The second semiconductor chip 24 may include an internal IC, and at least one pad 26 connected to the internal IC may be formed on the active surface of the second semiconductor chip 24. The pad 26 may include at least one material selected from the group consisting of aluminium, copper, silver, gold, and palladium.

The second semiconductor chip 24 may be a memory chip. The memory chip may include memory chips having various shapes, for example, a DRAM circuit, an SRAM circuit, a flash circuit, a PRAM circuit, an ReRAM circuit, an FeRAM circuit, or an MRAM circuit.

The first semiconductor chip 10 may be a semiconductor chip that has passed an electrical test performed on the wafer 60. The second semiconductor chip 24 may be disposed on the first semiconductor chip 10 that has passed the electrical test. Accordingly, before mounting the second semiconductor chip 24 on the first semiconductor chip 10, the electrical test may be performed on the wafer 60 so that it can be determined whether the first semiconductor chip 10 is good or defective. Therefore, a failure rate of the wafer-level package may be reduced, and fabrication costs may be reduced.

Also, an under-fill member 42 may be disposed between the first and second semiconductor chips 10 and 24.

Referring to FIG. 10, a molding member 40 may be formed on the entire surface of the wafer 60 to expose a top surface of the first solder ball 22 and a top surface (i.e., inactive surface) of the second semiconductor chip 24.

Specifically, the molding member 40 may be formed by adhering a release tape (not shown) to the top surfaces of the first solder ball 22 and the second semiconductor chip 24 such that the top surfaces of the first solder ball 22 and the second semiconductor chip 24 are not covered with the molding member 40. Thereafter, the release tape may be removed. Also, the release tape may protect the second semiconductor chip 24 and the first solder ball 22 from stress during the formation of the molding member 40.

Referring to FIG. 11, a second solder ball 30 may be formed on the first solder ball 22. The second solder ball 30 may be formed using a binary alloy or a ternary alloy. The binary alloy may be tin-silver, tin-copper, tin-zinc, or tin-bismuth, and the ternary alloy may be tin-silver-copper, tin-silver-indium, or tin-bismuth-zinc. The wafer-level package 1 of FIG. 13 may be electrically connected to an external apparatus (e.g., a mainboard) through the second solder ball 30.

Figure 12:
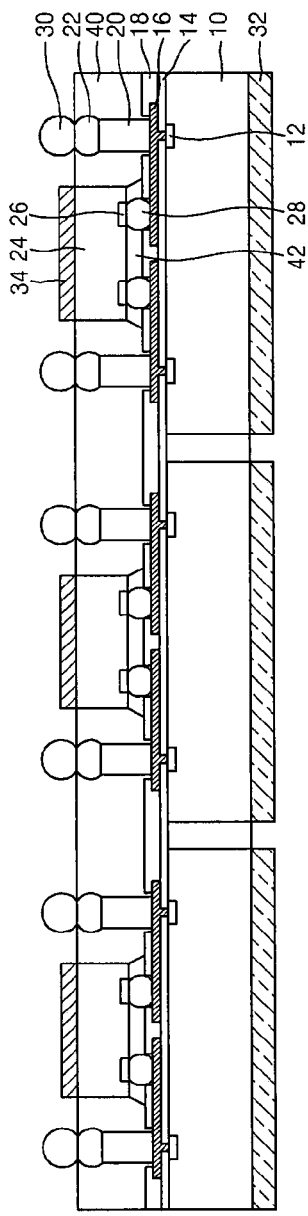

Referring to FIG. 12, a first heat sink 32 may be disposed on a bottom surface of the first semiconductor chip 10, or a second heat sink 34 may be disposed on a top surface of the second semiconductor chip 24.

Since the second semiconductor chip 24, and the copper post 20, the first solder ball 22, and the second solder ball 30 required for electrical connection to the external apparatus are formed on the top surface of the first semiconductor chip 10, the first heat sink 32 may be further disposed on the bottom surface of the first semiconductor chip 10, and it may be unnecessary to form a solder ball required for electrical connection to the external apparatus on the bottom surface of the first semiconductor chip 10, thereby simplifying the process.

Figure 13:
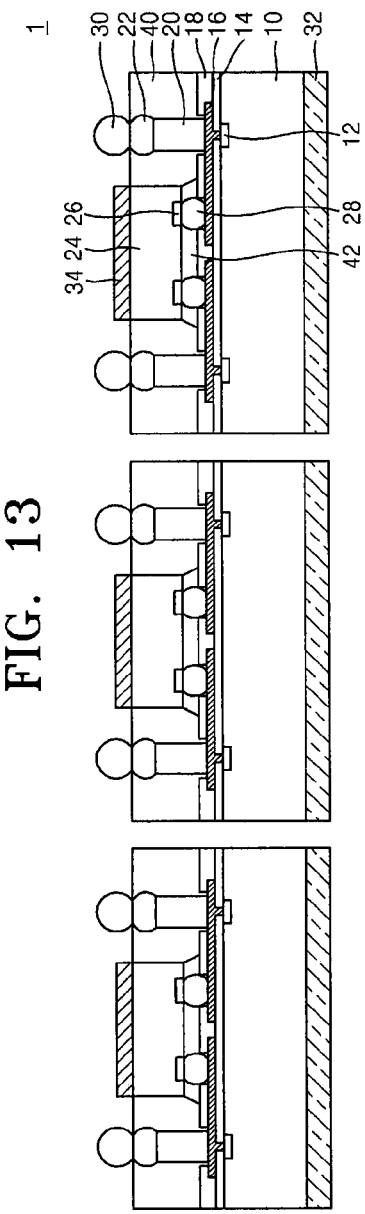

Referring to FIG. 13, the wafer 60 may be separated using a singulation process into wafer-level packages 1, each of which includes the first semiconductor chip 10 and the second semiconductor chip 24 stacked on the first semiconductor chip 10.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A wafer-level package comprising:
   a first semiconductor chip on an upper side of which an active surface facing downward is disposed;
   a redistribution formed on the active surface of the first semiconductor chip;

a second semiconductor chip disposed on the redistribution using a flip-chip bonding (FCP) technique;

a copper (Cu) post and a first solder ball sequentially disposed on the redistribution;

a molding member formed on the active surface of the first semiconductor chip to expose a bottom surface of the first solder ball and an inactive surface of the second semiconductor chip; and a second solder ball disposed on the first solder ball and electrically connected to an external apparatus.

2. The package of claim 1, wherein the copper post and the first solder ball are formed apart from the second semiconductor chip.

3. The package of claim 1, wherein the second semiconductor chip has a smaller width than the first semiconductor chip.

4. The package of claim 1, further comprising a first heat sink disposed on a top surface of the first semiconductor chip.

5. The package of claim 1, further comprising a second heat sink disposed on a bottom surface of the second semiconductor chip.

6. The package of claim 1, wherein the redistribution is electrically connected to a pad of the first semiconductor chip.

7. The package of claim 1, wherein the bottom surface of the first solder ball is at the same level as the inactive surface of the second semiconductor chip.

* * * * *